(12) United States Patent
Sugiyama et al.

(10) Patent No.: US 10,204,733 B2
(45) Date of Patent: Feb. 12, 2019

(54) MODULE SUBSTRATE

(71) Applicant: TAIYO YUDEN CO., LTD., Tokyo (JP)

(72) Inventors: Yuichi Sugiyama, Tokyo (JP); Masashi Miyazaki, Tokyo (JP); Yutaka Hata, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 15/203,366

(22) Filed: Jul. 6, 2016

(65) Prior Publication Data

US 2017/0025218 A1    Jan. 26, 2017

(30) Foreign Application Priority Data

Jul. 21, 2015 (JP) .................................. 2015-144185

(51) Int. Cl.
*H01F 27/28* (2006.01)
*H01F 27/24* (2006.01)
(Continued)

(52) U.S. Cl.
CPC ..... *H01F 27/2804* (2013.01); *H01F 17/0006* (2013.01); *H01F 17/062* (2013.01); *H01F 27/245* (2013.01); *H01L 23/49822* (2013.01); *H01L 28/00* (2013.01); *H05K 1/165* (2013.01); *H01F 2027/2814* (2013.01); *H01L 23/49827* (2013.01); *H01L 2224/16225* (2013.01); *H01L 2224/16227* (2013.01); *H01L 2924/14* (2013.01); *H01L 2924/15311* (2013.01);
(Continued)

(58) Field of Classification Search
CPC .............................................. H01F 2027/2814
USPC ........................................................ 336/229
See application file for complete search history.

(56) References Cited

U.S. PATENT DOCUMENTS

| | | | | |
|---|---|---|---|---|
| 5,705,852 A | * | 1/1998 | Orihara | ............ G06K 19/07749 257/679 |
| 6,990,729 B2 | * | 1/2006 | Pleskach | ............. H01F 17/0033 156/250 |

(Continued)

FOREIGN PATENT DOCUMENTS

| CN | 1871671 A | 11/2006 |
|---|---|---|
| CN | 1871673 A | 11/2006 |

(Continued)

OTHER PUBLICATIONS

Taiwanese Office Action dated Mar. 16, 2017, in a counterpart Taiwanese patent application No. 105113568.

(Continued)

*Primary Examiner* — Ronald Hinson
(74) *Attorney, Agent, or Firm* — Chen Yoshimura LLP

(57) ABSTRACT

Provided is a module substrate including an inductor that can be made thinner and smaller. A module substrate according to an aspect of the present invention includes a substrate member having a mounting surface on which electronic components are mounted, a magnetic core disposed within the substrate member, and a conductor coil provided in the substrate member and wound around the magnetic core. The module substrate has a configuration in which an inductor is built into the substrate member, which makes it possible to make the overall module substrate smaller and thinner.

5 Claims, 14 Drawing Sheets

(51) Int. Cl.
*H01F 17/04* (2006.01)
*H01F 5/00* (2006.01)
*H01F 27/245* (2006.01)
*H01F 17/00* (2006.01)
*H01F 17/06* (2006.01)
*H05K 1/16* (2006.01)
*H01L 49/02* (2006.01)
*H05K 1/18* (2006.01)
*H01L 23/498* (2006.01)
*H05K 1/05* (2006.01)
*H05K 3/44* (2006.01)

(52) U.S. Cl.
CPC ............ *H01L 2924/19041* (2013.01); *H01L 2924/19043* (2013.01); *H01L 2924/19105* (2013.01); *H05K 1/056* (2013.01); *H05K 1/181* (2013.01); *H05K 3/445* (2013.01); *H05K 2201/086* (2013.01)

(56) References Cited

U.S. PATENT DOCUMENTS

| | | | | |
|---|---|---|---|---|
| 9,440,378 | B2* | 9/2016 | Dalmia | .................... B29C 39/10 |
| 2005/0052268 | A1 | 3/2005 | Pleskach et al. | |
| 2005/0212642 | A1* | 9/2005 | Pleskach | .............. H01F 17/0033 336/200 |
| 2005/0277282 | A1* | 12/2005 | Horikawa | ............ H05K 3/4046 438/618 |
| 2007/0040643 | A1* | 2/2007 | Inoue | .................... H01F 17/045 336/213 |
| 2014/0043130 | A1* | 2/2014 | Dalmia | ............... H01F 17/0006 336/200 |
| 2014/0218147 | A1 | 8/2014 | Chatani et al. | |
| 2014/0259643 | A1 | 9/2014 | Marcoci | |
| 2015/0010694 | A1 | 1/2015 | Miyazaki et al. | |
| 2015/0083472 | A1 | 3/2015 | Shiratori et al. | |
| 2015/0235753 | A1* | 8/2015 | Chatani | ................. H01F 27/245 336/200 |

FOREIGN PATENT DOCUMENTS

| | | |
|---|---|---|
| CN | 103907164 A | 7/2014 |
| CN | 104380846 A | 2/2015 |
| EP | 0856855 A2 | 8/1998 |
| JP | 10-223447 A | 8/1998 |
| JP | 2006-165212 A | 6/2006 |
| JP | 2014-168041 A | 9/2014 |
| TW | 181393 A | 4/1992 |
| TW | 201436679 A | 9/2014 |
| TW | 201509251 A | 3/2015 |

OTHER PUBLICATIONS

Taiwanese Office Action dated Jun. 21, 2017, in a counterpart Taiwanese patent application No. 105113568.
Taiwanese Office Action dated Sep. 25, 2017, in a counterpart Taiwanese patent application No. 105113568.
Chinese Office Action dated Aug. 14, 2017, in a counterpart Chinese patent application No. 201610564819.X. (A machine translation (not reviewed for accuracy) attached.).
Chinese Office Action dated May 8, 2018, in a counterpart Chinese patent application No. 201610564819.X. (A machine translation (not reviewed for accuracy) attached.).

* cited by examiner

MODULE SUBSTRATE

BACKGROUND OF THE INVENTION

Technical Field

The present invention relates to a module substrate, and particularly relates to a module substrate including a magnetic core and a coil wound around the magnetic core.

Background Art

The growth of information communication industries has led to more diverse demands with respect to electronic devices. For example, components are being mounted on main substrates at higher densities, the main substrates themselves are being made smaller and thinner, functional blocks are being modularized, and so on in order to realize devices provided with a variety of additional functions.

For example, Patent Document 1 discloses a power module including a circuit substrate and an inductor. The circuit substrate has a counter surface on which electronic components such as switching transistors, a power control IC, capacitors, and the like are mounted. Meanwhile, the inductor includes a magnetic core formed from a soft magnetic metal powder having a flat-like shape and a binder made of an insulating resin, and a metal coil having a high thermal conductivity, and is disposed facing the counter surface of the circuit substrate.

RELATED ART DOCUMENT

Patent Document

Patent Document 1: Japanese Patent Application Laid-Open Publication No. 2014-168041

SUMMARY OF THE INVENTION

Recently, the large size of components mounted on power modules has led to a strong demand for reducing the size of power modules. However, because the power module disclosed in Patent Document 1 is formed from a multilayer member having a circuit substrate and an inductor, it is difficult to make the power module smaller and thinner.

In light of the circumstances described above, an object of the present invention is to provide a module substrate including an inductor that can be made thinner and smaller. Accordingly, the present invention is directed to a scheme that substantially obviates one or more of the above-discussed and other problems due to limitations and disadvantages of the related art.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a module substrate, including:
a substrate member having a mounting surface configured to mount an electronic component;
a magnetic core embedded inside the substrate member; and
a conductor coil, provided in the substrate member, that is wound around the magnetic core, thereby constituting an embedded inductor.

In the module substrate, the magnetic core and the conductor coil form an inductor provided integrally with the substrate member. Accordingly, the module substrate has a configuration in which the inductor is built into the substrate member, which makes it possible to make the overall module substrate smaller and thinner.

The substrate member may include a resin layer formed from a first synthetic resin material having a first elastic modulus. In this case, the magnetic core is disposed within the resin layer.

This makes it easy to embed the magnetic core in the substrate member.

The magnetic core may include an elastic layer, disposed inside or on an outer surface of the magnetic core, that is formed from a second synthetic resin material having a second elastic modulus lower than the first elastic modulus.

This makes it possible to build the magnetic core into the substrate member without causing a drop in the soft magnetic properties of the magnetic core even in the case where the magnetic core is formed from a material having comparatively high magnetostriction.

The magnetic core may be constituted by a multilayer member of magnetic plates that are stacked in a thickness direction of the substrate member or in a direction orthogonal to the thickness direction, the magnetic plates sandwiching the elastic layer.

Alternatively, the elastic layer may be disposed within the resin layer so as to cover an outer surface of the magnetic core.

There is no special limitation on the shape of the magnetic core, and the magnetic core may have a toroidal shape, for example.

In this case, the conductor coil includes interlayer connecting portions and wiring groups. A plurality of the interlayer connecting portions are provided on both an inner circumferential side and an outer circumferential side of the magnetic core, the interlayer connecting portions passing through the substrate member in a thickness direction of the substrate member. The wiring groups are provided on both one surface and another surface of the substrate member, and interconnect the plurality of interlayer connecting portions in an alternating manner along a circumferential direction of the magnetic core.

Accordingly, a coil portion of an inductor can be configured using a wiring layer of the substrate member.

The substrate member may be formed from a metal base material having a cavity. In this case, the magnetic core is disposed in the cavity.

This makes it possible to suppress noise from propagating to the periphery of the inductor.

As described above, according to the present invention, a module substrate including an inductor can be made thinner and smaller.

DETAILED DESCRIPTION OF EMBODIMENTS

Embodiments of the present invention will be described hereinafter with reference to the drawings.

Embodiment 1

Figure 1:
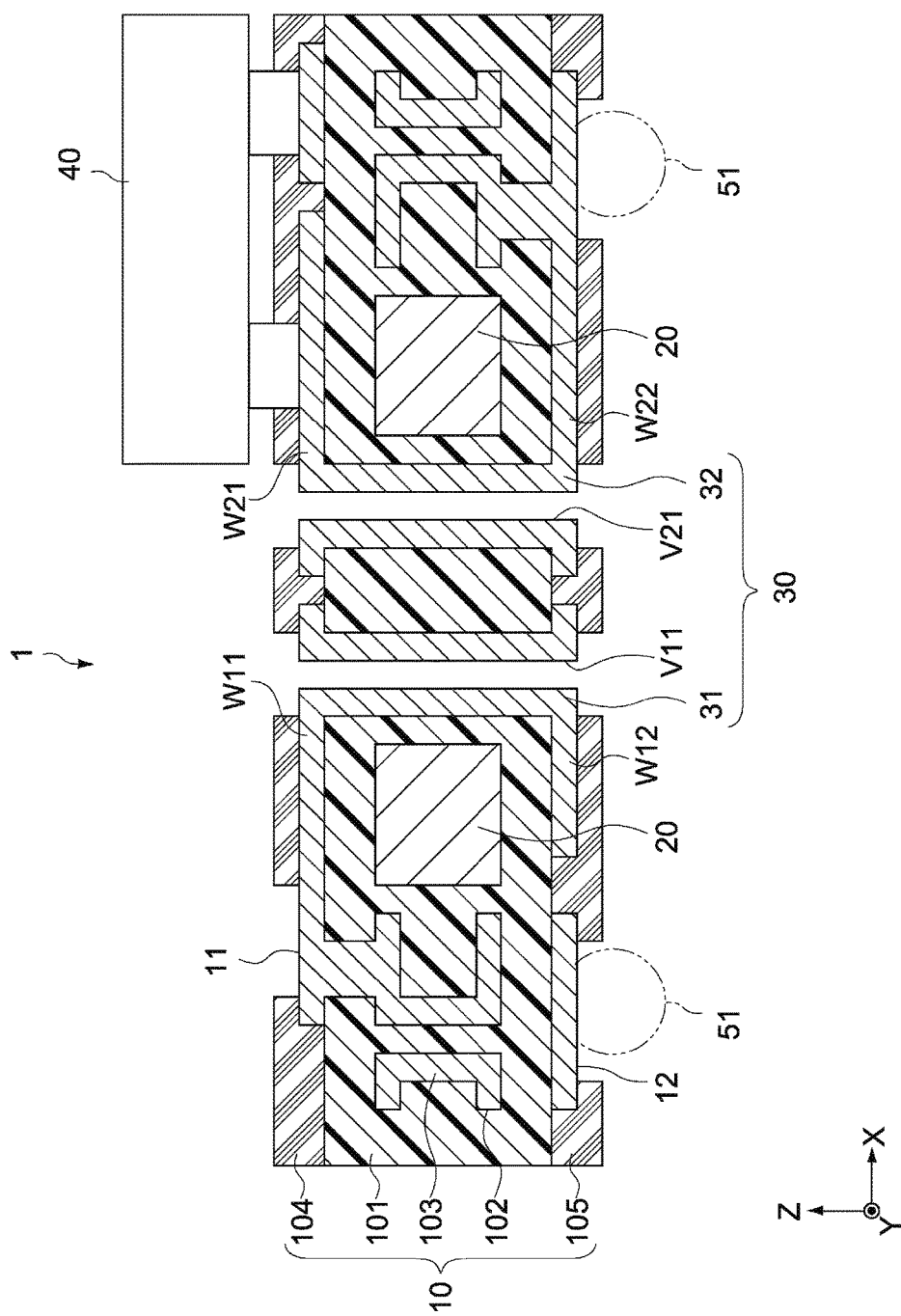
FIG. 1 is a general side cross-sectional view illustrating the configuration of a module substrate according to Embodiment 1 of the present invention.

FIG. 1 is a general side cross-sectional view illustrating the configuration of a module substrate according to an embodiment of the present invention.

Note that in FIG. 1, an X axis, a Y axis, and a Z axis indicate three axial directions that are orthogonal to each other, where the X axis and the Y axis correspond to in-plane directions of the module substrate and the Z axis corresponds to a thickness direction thereof (the same applies in the other drawings as well).

<Overview of Module Substrate>

A coil component is generally a major factor making it difficult to reduce the size of a power module. Because a coil component is larger than passive components such as capacitors, resistors, and the like, even using a three-dimensional mounting technique, such as with a component-embedded substrate in which components are built into the substrate, provides only a limited size reduction effect. As such, although building a coil into a substrate using wiring can be considered, it is difficult to obtain satisfactory properties with a coil created from substrate materials alone. On the other hand, increasing the size of the substrate cannot be avoided if satisfactory properties are to be obtained.

Accordingly, in a module substrate 1 according to the present embodiment, a magnetic core constituted by an iron core that passes through a coil is embedded into a substrate. Doing so makes it possible to make the overall module smaller and thinner while improving the electrical properties of the coil as needed for an inductor.

The module substrate 1 according to the present embodiment will be described in detail hereinafter.

The module substrate 1 according to the present embodiment is configured as a power module. The module substrate 1 includes a substrate member 10, a magnetic core 20, and a conductor coil 30. The magnetic core 20 and the conductor coil 30 are provided within the substrate member 10, and the conductor coil 30 functions as a coil wound around the magnetic core 20.

(Substrate Member)

The substrate member 10 has a mounting surface 11 onto which electronic components 40 are mounted, and a terminal surface 12 on the opposite side therefrom. The electronic components 40 include active elements such as IC components and the like, as well as passive elements such as capacitors, resistors, and the like. Such electronic components 40 are mounted upon the mounting surface 11 of the substrate member 10.

On the other hand, a plurality of external connection terminals 51 such as solder bumps and plate bumps are provided on the terminal surface 12, and other wiring substrates, a control substrate for electronic components (a motherboard), and the like are mounted via these external connection terminals 51.

The substrate member 10 is constituted of a multilayer wiring substrate. In the present embodiment, the substrate member 10 includes a resin layer 101 formed from a synthetic resin material. The substrate member 10 furthermore includes wiring layers 102 formed on a top surface, a bottom surface, and within the resin layer 101, vias (interlayer connecting portions) that form connections between wiring layers 102, and insulating layers 104 and 105 such as solder resists laminated onto a front surface and a rear surface of the resin layer 101.

There are no special limitations on the synthetic resin material of which the resin layer 101 is formed, and a generic thermosetting resin material such as an epoxy resin, a phenol resin, a BT resin, or the like is typically used. The synthetic resin material may contain a filler such as glass fibers or oxide particles in order to achieve a desired mechanical strength.

The wiring layers 102 constitute an upper wiring layer connected to the electronic components 40 mounted on the mounting surface 11 and a lower wiring layer connected to the external connection terminals 51 provided on the terminal surface 12.

The insulating layers 104 and 105 are formed through patterning on the upper surface and the lower surface, respectively, of the resin layer 101 so as to partially expose the upper wiring layer and the lower wiring layer.

(Magnetic Core)

Figure 2:
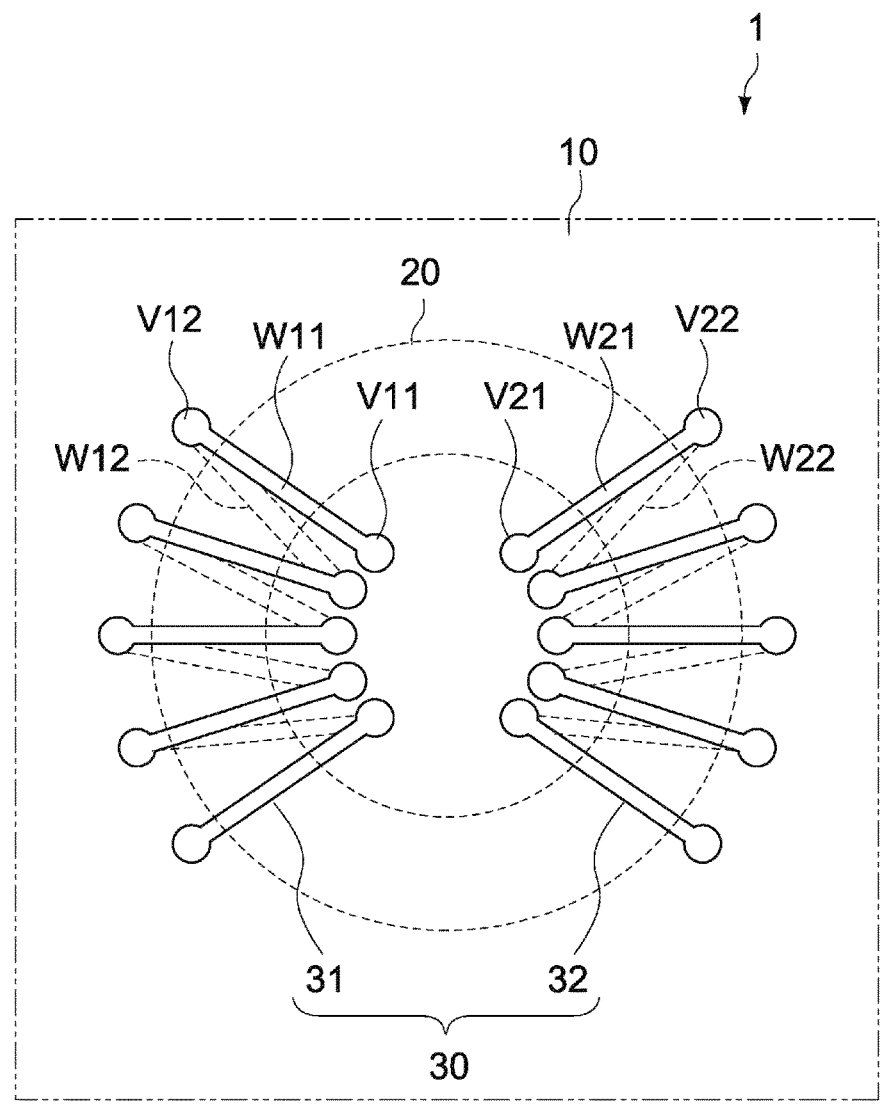
FIG. 2 is a plan view of primary elements of the stated module substrate.

The magnetic core 20 is disposed within the substrate member 10, and in the present embodiment, is embedded within the resin layer 101. FIG. 2 is a plan view of primary elements of the module substrate 1.

In the present embodiment, the magnetic core 20 is configured as a toroidal core having an axial center parallel to the thickness direction of the substrate member 10. There is no special limitation on the size of the magnetic core 20, which may have, for example, an outer diameter of 4 mm, an inner diameter of 2 mm, and a thickness of 0.2 mm to 0.5 mm.

There is no special limitation on the material of which the magnetic core 20 is formed as long as the material is a ferromagnetic material having soft magnetic properties.

Typically, a material having a high magnetic permeability is used, such as an oxide material such as ferrite, an alloy material such as permalloy or Sendust, an iron, cobalt, or nickel-based amorphous alloy material, or the like.

The magnetic core 20 may be formed from a metallic magnetic foil, a sintered compact of a magnetic powder, or the like. For example, the magnetic core 20 may be a metallic magnetic multilayer member, roll, or punched-out body. Typically, the magnetic core 20 is formed from a nonconductive body. To ensure insulating properties in the magnetic core 20, for example, the magnetic core 20 may be formed from a composite material in which a magnetic powder is dispersed throughout an insulating resin material, the outside of the magnetic core 20 may be covered in an insulating resin material, or the like.

Figure 3A:
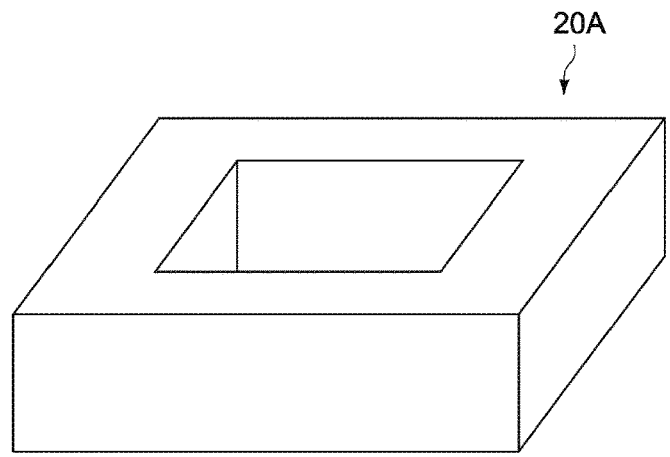
FIGS. 3A to 3C are overall perspective views illustrating examples of the configuration of a magnetic core in the stated module substrate.
Figure 3B:
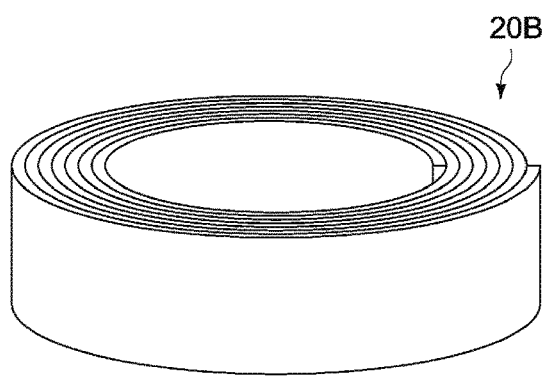
Figure 3C:
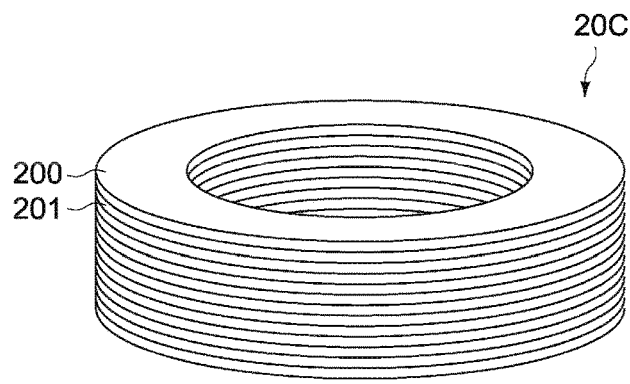

FIGS. 3A to 3C are overall perspective views illustrating examples of the configuration of the magnetic core 20.

For example, a magnetic core 20A illustrated in FIG. 3A is formed from a sintered compact of a ferrite magnetic powder. The shape of the core member is not limited to a circular annular shape, and may be a quadrangular annular shape, as illustrated in the drawing.

Meanwhile, a magnetic core 20B illustrated in FIG. 3B is formed from a roll obtained by winding a long, thin magnetic band into a concentric shape, whereas a magnetic core 20C illustrated in FIG. 3C is formed as a multilayer member obtained by laminating a plurality of annular thin magnetic plates 200 in a thickness direction with adhesive layers 201 therebetween.

The magnetic core 20 forms a path along which a magnetic field produced by electrifying the conductor coil 30 travels (called a "magnetic path" hereinafter), and generally speaking, higher inductor properties (inductance) can be obtained the greater the volume of the magnetic path is. The magnetic core 20A illustrated in FIG. 3A is formed as a solid entity, and thus a volume based on the shape into which the entity is processed can be obtained. On the other hand, in the magnetic cores 20B and 20C illustrated in FIGS. 3B and 3C, the magnetic body is in a foil or thin plate form, and thus a desired volume can be obtained by laminating (winding) such a magnetic plate in the planer direction of the substrate member 10 (FIG. 3B), laminating such magnetic plates in the thickness direction of the substrate member 10 (FIG. 3C), or the like.

(Magnetostriction of Magnetic Core)

Soft magnetic materials are generally known to exhibit a phenomenon known as magnetostriction, where the shape or length thereof changes in response to a magnetic field being applied. While the magnitude of magnetostriction differs depending on the material, with a magnetic material exhibiting comparatively high magnetostriction, changes in shape caused by the magnetostriction are suppressed by the effects of stress acting on the magnetic body. As a result, it may not be possible to obtain expected high magnetic permeability properties. In particular, in the case where the resin layer 101 is formed from a synthetic resin material, which undergoes a comparatively large volume change when heated, the original magnetic properties of the magnetic core may deteriorate greatly after the magnetic core is embedded in the resin layer 101.

Figure 4:
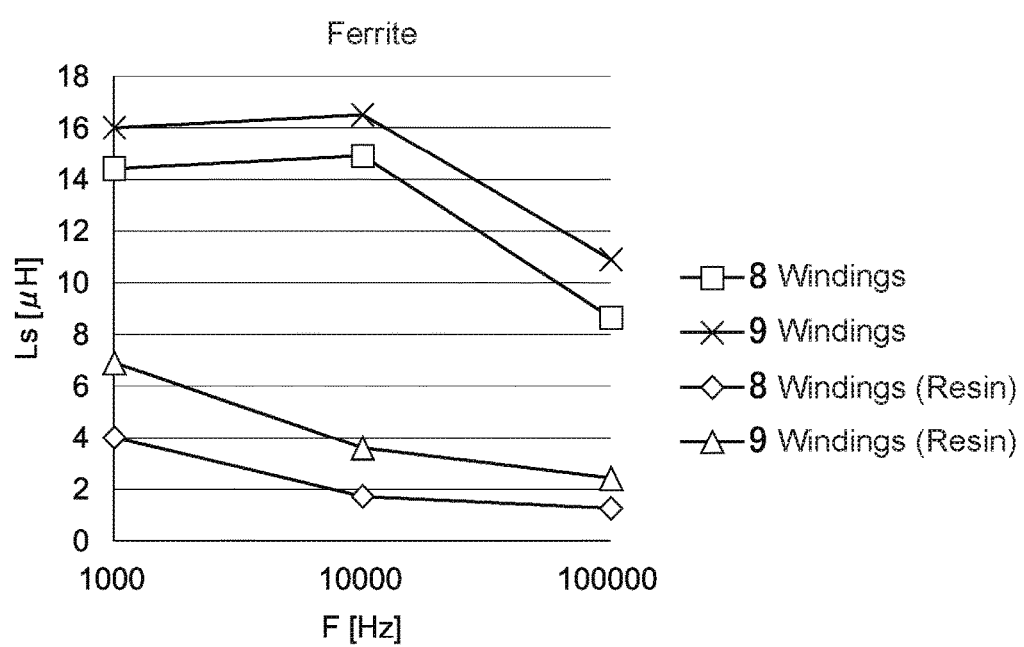
FIG. 4 illustrates results of an experiment measuring a change in inductance before and after a magnetic core is embedded in a resin layer, using an inductor having a magnetic core made of ferrite.

For example, FIG. 4 illustrates an example of changes in an inductance measured before and after a magnetic core is embedded in a resin layer, using an inductor having a magnetic core made of ferrite. In FIG. 4, the vertical axis represents the inductance (Ls[μH]) and the horizontal axis represents the alternating frequency (Hz) of an external magnetic field; the number of turns in the coil was eight turns or nine turns. From FIG. 4, it can be seen that the inductance (Ls) is greatly degraded after the magnetic core is embedded in the resin layer, compared to before the magnetic core is embedded in the resin layer. This is thought to be because ferrite exhibits comparatively high magnetostriction.

Figure 5:
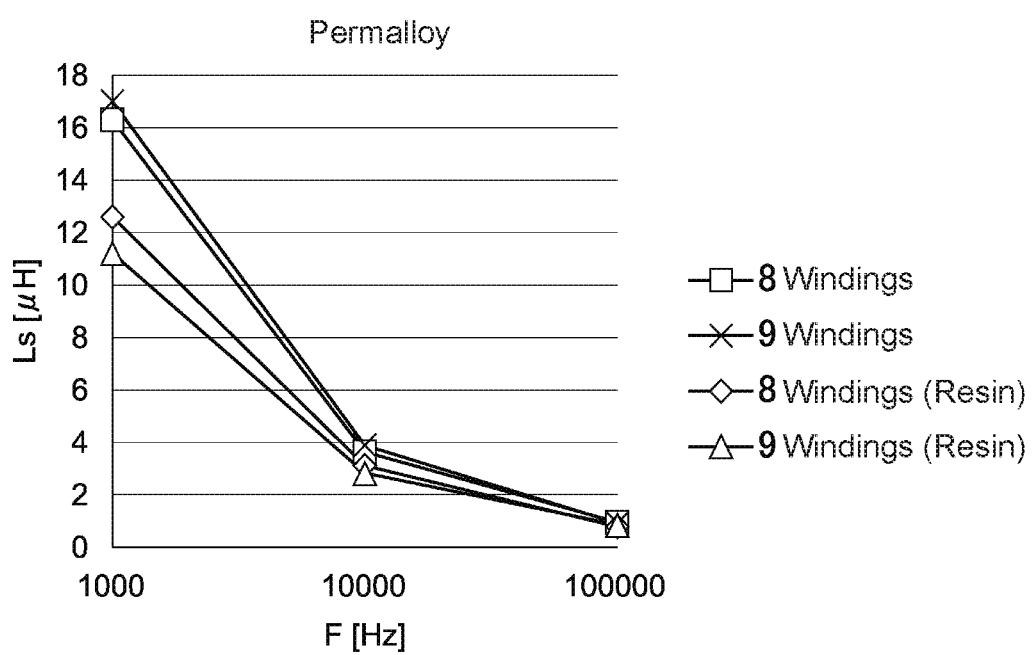
FIG. 5 illustrates results of an experiment measuring a change in inductance before and after a magnetic core is embedded in a resin layer, using an inductor having a magnetic core made of permalloy.
Figure 6:
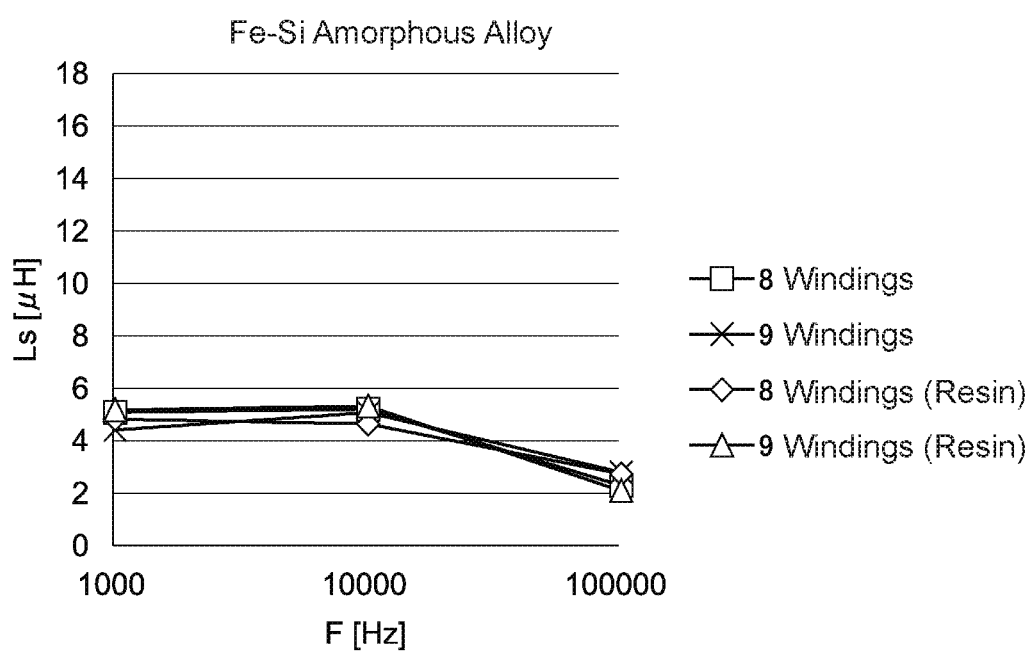
FIG. 6 illustrates results of an experiment measuring a change in inductance before and after a magnetic core is embedded in a resin layer, using an inductor having a magnetic core made of an Fe—Si based amorphous alloy.

The same experiment was carried out on inductors in which the magnetic core is formed from permalloy (a Fe—Ni based alloy) and an Fe—Si based amorphous alloy. The results of these measurements are illustrated in FIGS. 5 and 6, respectively. As illustrated in FIGS. 5 and 6, the inductance was confirmed as changing less between before and after the magnetic core was embedded in the resin layer in the case where the magnetic core is formed from permalloy or the stated amorphous alloy compared to the case where the magnetic core is formed from ferrite. This is presumed to be because permalloy and the stated amorphous alloy exhibit less magnetostriction than ferrite.

Accordingly, it is preferable that the magnetic core 20 embedded in the resin layer 101 be formed from a magnetic material having comparatively low magnetostriction (for example, a magnitude of magnetostriction (a magnetostrictive constant) of no greater than ±25E-6). Doing so suppresses changes in the magnetic properties of the magnetic core 20 between before and after the magnetic core 20 is embedded in the resin layer 101, making it possible to ensure inductor properties as intended by design even after the magnetic core 20 is embedded in the resin layer 101.

On the other hand, it is also possible to suppress the magnetic properties of the magnetic core from degrading by providing the magnetic core 20 embedded in the resin layer 101 with a buffer layer capable of easing stress from the resin layer 101. This makes it possible to suppress the inductor properties from changing between before and after the magnetic core 20 is embedded in the resin layer 101 even in the case where the magnetic core 20 is formed from a magnetic material having comparatively high magnetostriction.

Typically, an elastic layer formed from a synthetic resin material (a second synthetic resin material) having a lower elastic modulus (a second elastic modulus) than the elastic modulus (a first elastic modulus) of the synthetic resin material of which the resin layer 101 is formed (a first synthetic resin material) applies as the stated buffer layer. An elastic resin material, adhesive material, or the like, such as silicone resin or urethane resin, can be given as examples of such an elastic layer. Meanwhile, the first and second elastic moduli may be adjusted by adjusting the content of a filler, and in this case, the same resin material can be used as the material for forming the resin layer 101 and the elastic layer.

Specifically, the adhesive layers 201 can be formed from the stated elastic layer in the magnetic core 20C illustrated in FIG. 3C, for example. By doing so, a stress easing effect is obtained among the magnetic plates 200, which eases stress from the resin layer 101. Accordingly, the magnetic core 20C can be embedded in the resin layer 101 without inhibiting the magnetostriction phenomenon of the magnetic plates 200.

Likewise, in the magnetic core 20B illustrated in FIG. 3B, a resin layer (buffer layer) functioning as the stated elastic layer may be interposed between turns of the thin magnetic band that is wound.

The elastic layer is not limited to an example in which the elastic layer is provided within the magnetic core 20B or 20C, and the elastic layer may be provided on an outer surface of the magnetic core. For example, in the magnetic core 20A illustrated in FIG. 3A, outer surfaces thereof (an upper surface, a lower surface, an outer peripheral surface, and an inner peripheral surface) may be covered by a resin layer or the like that functions as the stated elastic layer.

(Conductor Coil)

The conductor coil 30 is provided in the substrate member 10 and is wound around the magnetic core 20. As illustrated in FIG. 2, the conductor coil 30 according to the present embodiment includes a primary coil portion 31 and a secondary coil portion 32, and with the magnetic core 20 constitutes a transformer, a common mode choke coil, or the like. In the case of a transformer, a primary current flows in the primary coil portion 31 and a secondary coil portion flows in the secondary coil portion 32. On the other hand, in the case of a common mode choke coil, a normal mode current flows in the primary coil 31, and a common mode current flows in the secondary coil portion 32.

The primary coil portion 31 is constituted by vias V11 and V12, provided in multiple at the inner periphery and the outer periphery, respectively, of the magnetic core 20, an upper wiring group W11 that constitutes part of the upper wiring layer of the substrate member 10, and a lower wiring group W12 that constitutes part of the lower wiring layer of the substrate member 10. The vias V11 and V12 are formed by the interlayer connecting portions passing through the substrate member 10 in the thickness direction thereof, and the vias V11 and V12 are connected to each other in an alternating manner along a circumferential direction of the magnetic core 20 through the upper wiring group W11 and the lower wiring group W12. In this manner, the primary coil portion 31 is configured as a conductor coil wound continuously and three-dimensionally around a region in part of the magnetic core 20.

Likewise, the secondary coil portion 32 is constituted by vias V21 and V22, provided in multiple at the inner periphery and the outer periphery, respectively, of the magnetic core 20, an upper wiring group W21 that constitutes part of the upper wiring layer of the substrate member 10, and a lower wiring group W22 that constitutes part of the lower wiring layer of the substrate member 10. The vias V21 and V22 are formed by the interlayer connecting portions passing through the substrate member 10 in the thickness direction thereof, and the vias V21 and V22 are connected to each other in an alternating manner along a circumferential direction of the magnetic core 20 through the upper wiring group W21 and the lower wiring group W22. In this manner, the secondary coil portion 32 is configured as a conductor coil wound continuously and three-dimensionally around a region in part of the magnetic core 20.

<Effects of Module Substrate>

In the module substrate 1 according to the present embodiment configured as described thus far, the magnetic core 20 and the conductor coil 30 form an inductor provided integrally with the substrate member 10. Accordingly, the module substrate 1 has a configuration in which the inductor is built into the substrate member 10, which makes it possible to make the overall module substrate smaller and thinner.

Figure 7:
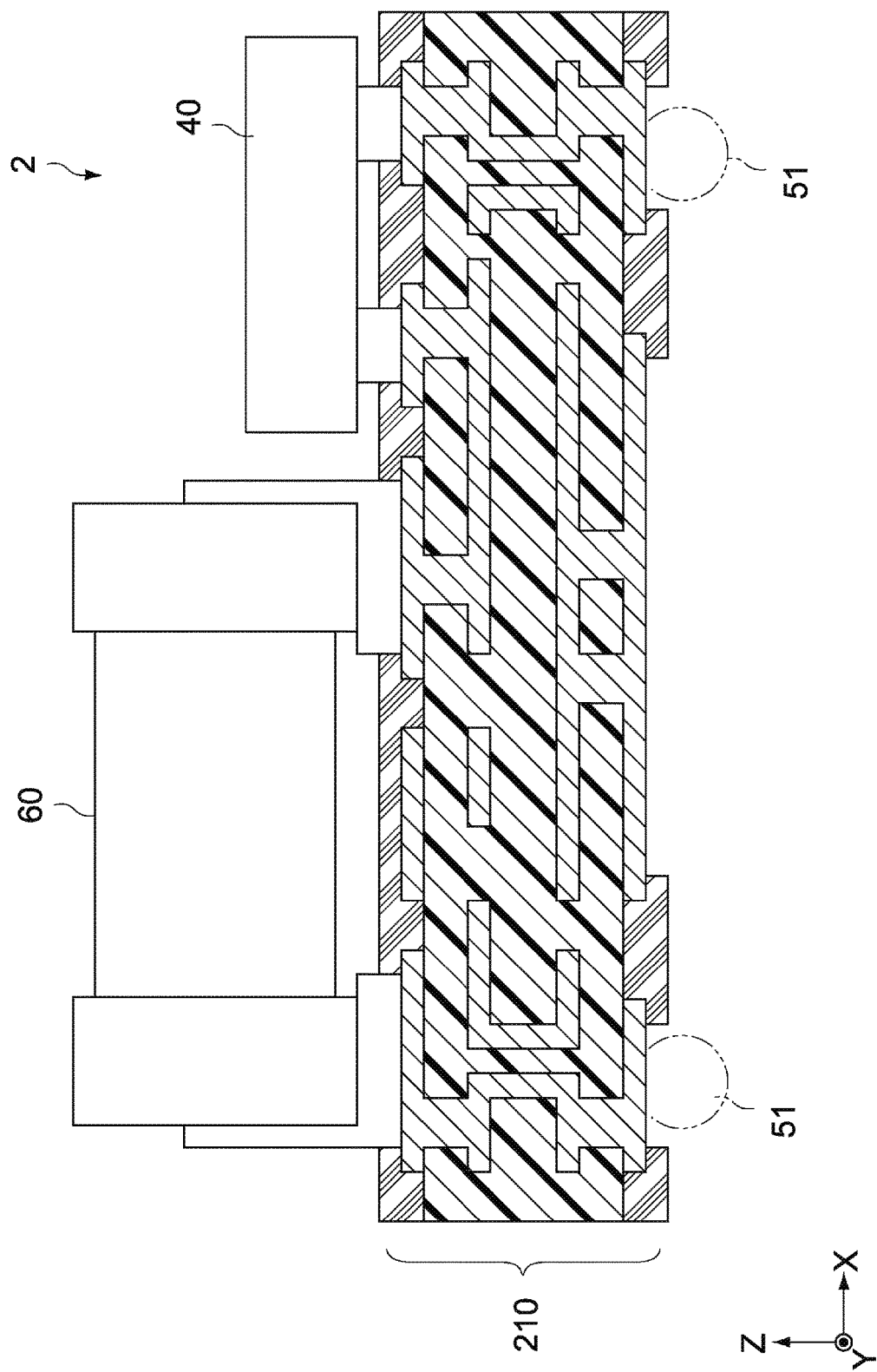
FIG. 7 is a general side cross-sectional view illustrating a module substrate according to a comparison example.
Figure 8A:
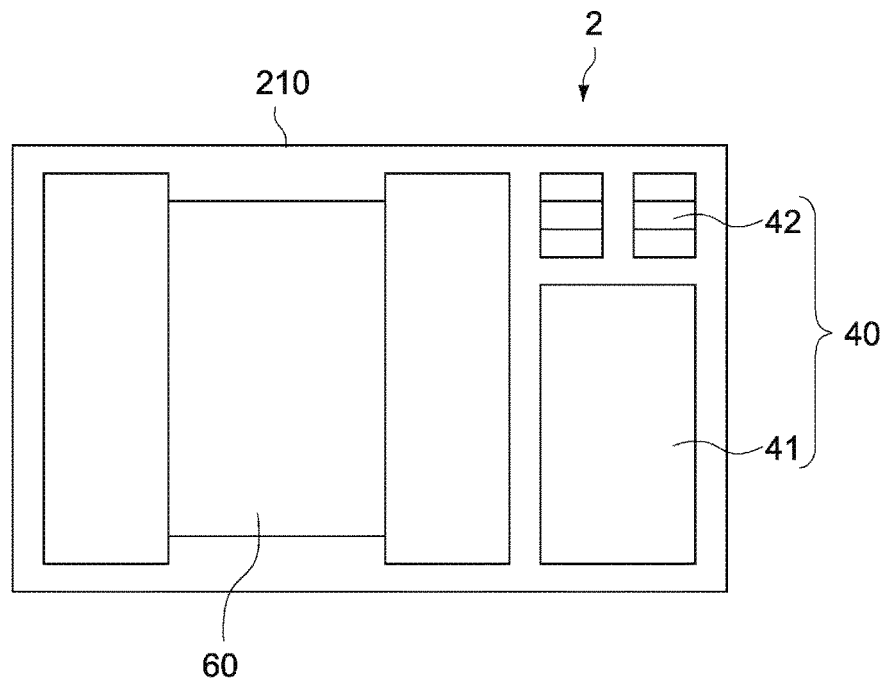
FIGS. 8A and 8B are general plan views comparing the module substrate according to the comparison example with the module substrate illustrated in FIG. 1.
Figure 8B:
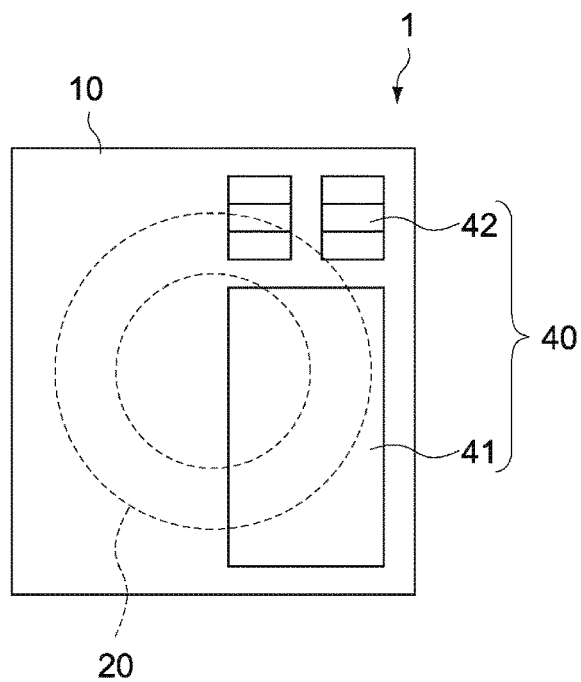

For example, FIG. 7 is a general side cross-sectional view illustrating a module substrate 2 according to a comparison example, and FIGS. 8A and 8B are general plan views comparing the module substrate 2 according to the comparison example with the module substrate 1 according to the present embodiment.

The module substrate 2 according to the comparison example includes a substrate member 210, and a plurality of electronic components 40 and an inductor 60 mounted on a mounting surface of the substrate member 210. The inductor 60 is constituted by a chip-type inductor element, and typically has a greater mounting surface area than the other electronic components 40, such as an IC component 41 and a capacitor 42. Thus according to the present embodiment, the module substrate 1 can be made smaller because the surface area of the substrate member 10 can be reduced compared to the comparison example, as illustrated in FIGS. 8A and 8B. Furthermore, according to the present embodiment, the magnetic core 20 and the conductor coil 30 are built into the substrate member 10. This makes it possible to reduce the mounting height of components on the mounting surface, which in turn makes it possible to make the module substrate 1 thinner.

In addition, according to the present embodiment, because the magnetic core 20 and the conductor coil 30 are built into the substrate member 10, other electronic components such as IC components can be mounted even directly above the regions where the magnetic core 20, the conductor coil 30, and so on are embedded, for example. This also makes it possible to make the module substrate 1 smaller and achieve a higher component mounting density.

Furthermore, according to the present embodiment, the magnetic core 20 is embedded within the insulating resin layer 101, and thus even in the case where the magnetic core 20 is conductive, the magnetic core 20 can be prevented from causing electrical short-circuits with other wiring portions. On the other hand, in the case where the magnetic core 20 is formed from a comparatively brittle material such as a ferrite sintered compact, embedding the magnetic core 20 in the resin layer 101 increases the mechanical strength, which makes it possible to realize a power module able to withstand drops, impacts, vibrations, and so on.

Further still, because the conductor coil 30 is formed using parts of the wiring layers 102 of the substrate member 10, the conductor coil 30 can be formed within the substrate member 10 without needing a separate coil member.

Embodiment 2

Figure 9:
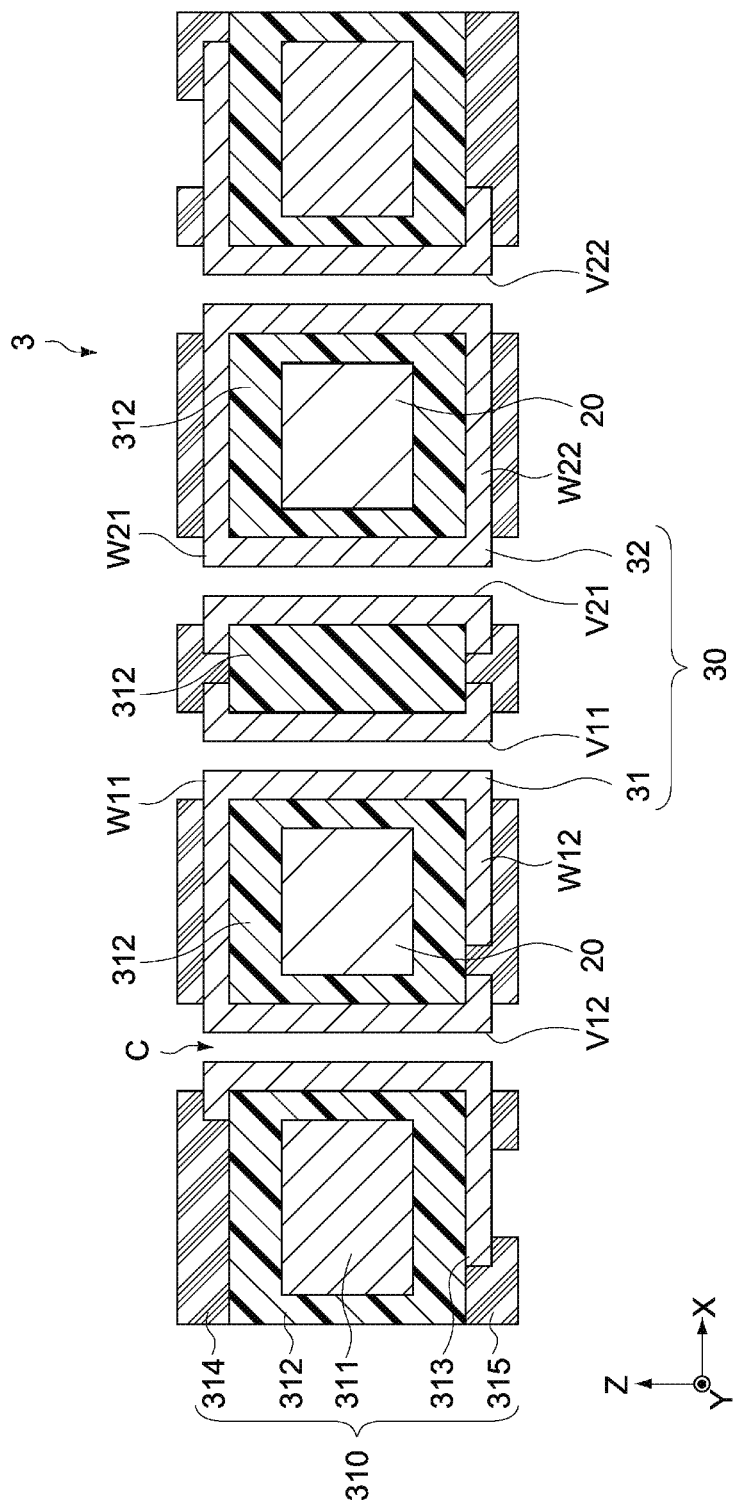
FIG. 9 is a general side cross-sectional view illustrating the configuration of a module substrate according to Embodiment 2 of the present invention.

FIG. 9 is a general side cross-sectional view illustrating the configuration of a module substrate according to Embodiment 2 of the present invention, and FIGS. 10A to 13 are general cross-sectional views of primary elements, illustrating steps in a method of manufacturing that module substrate.

The following will mainly describe elements that are different from the Embodiment 1. Elements that are the same as those in the above-described embodiment will be given the same reference numerals and descriptions thereof will be omitted.

A module substrate 3 according to the present embodiment includes a substrate member 310, the magnetic core 20, and the conductor coil 30.

One surface (an upper surface, for example) of the substrate member 310 is formed as a mounting surface onto which electronic components are mounted, and another surface (a lower surface, for example) is formed as a terminal surface to which external connection terminals are connected.

The magnetic core 20 and the conductor coil 30 are provided within the substrate member 310, and the conductor coil 30 functions as a coil wound around the magnetic core 20.

In the present embodiment, the substrate member 310 includes a base material 311 made of metal. The base material 311 is formed from a metal material that is highly conductive and has high heat dissipation properties, such as copper, and has one or more cavities C at desired locations in the material plane. The magnetic core 20 and the conductor coil 30 are disposed within the cavities C of the base material 311.

Although no special limitations are placed on the thickness of the base material 311, the base material 311 is assumed to have substantially the same thickness as the magnetic core 20, for example. Meanwhile, although the cavities C are formed as open-ended openings so as to pass through the base material 311 in the thickness direction thereof, the cavities C may be closed-ended openings (recesses).

The substrate member 310 further includes a resin layer 312 that covers the upper surface and lower surface of the base material 311 and circumferential surfaces of the cavities C, and wiring layers 313 formed on the surfaces of and within the resin layer 312.

The substrate member 310 will be described in detail along with a method of manufacturing the module substrate 3.

Figure 10A:
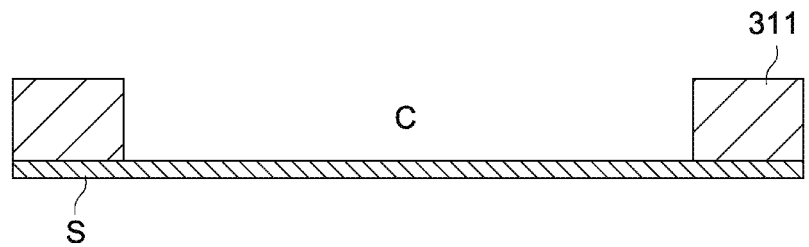
FIGS. 10A to 10D are general cross-sectional views of primary elements, illustrating steps in a method of manufacturing the module substrate illustrated in FIG. 9.

First, as illustrated in FIG. 10A, a removable temporary anchoring sheet S is affixed to the lower surface of the base material 311 in which the cavity C is formed. The cavity C can be formed in the base material 311 through pattern etching, a punching process, a drilling process, or the like, for example. A sheet of any suitable material, such as a metal sheet, a resin sheet, or a paper sheet, can be employed as the temporary anchoring sheet S.

Figure 10B:
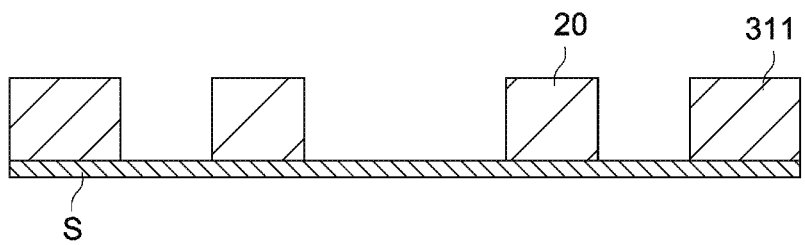
Figure 12:
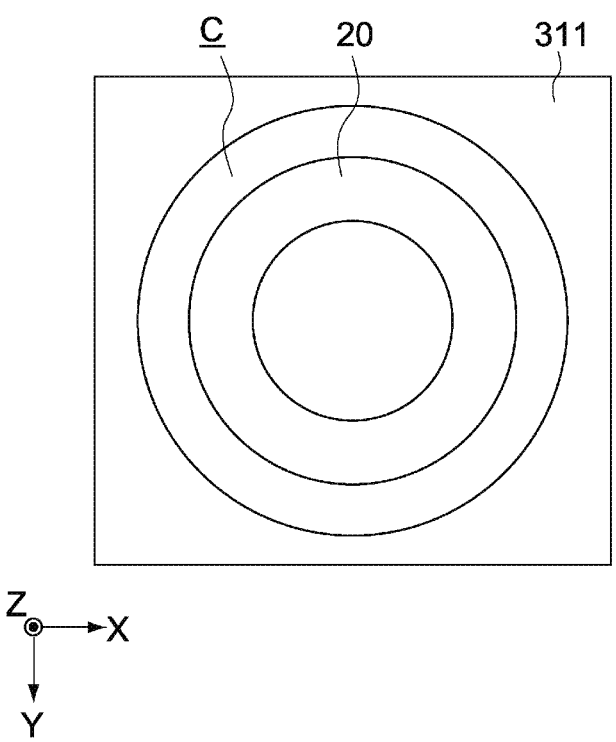
FIG. 12 is a general plan view of primary elements, illustrating a step in the manufacture of the module substrate illustrated in FIG. 9.

Next, as illustrated in FIG. 10B, the magnetic core 20 is disposed on the temporary anchoring sheet S so as to be contained within the cavity C of the base material 311. FIG. 12 is a general plan view of the base material 311 containing the magnetic core 20. The magnetic core 20 has the same configuration as in the Embodiment 1, and the magnetic cores 20A to 20C illustrated in FIGS. 3A to 3C are used, for example.

Figure 10C:
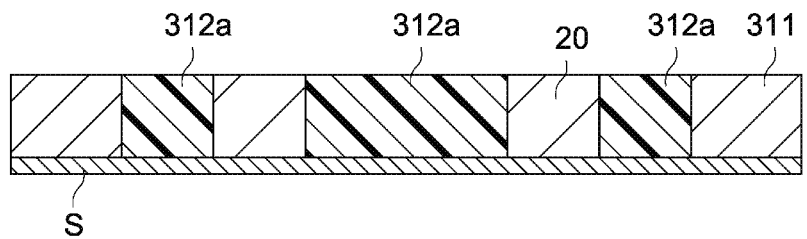
Figure 10D:
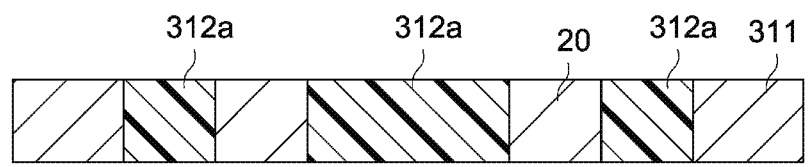

Next, as illustrated in FIG. 10C, the interior of the cavity C and a central hollow are of the magnetic core 20 are filled with a synthetic resin material, which is then cured to form an inner resin layer 312a. There are no special limitations on the stated synthetic resin material, and a thermosetting resin material such as an epoxy resin or the like is typically used. The temporary anchoring sheet S is then removed from the base material 311, as illustrated in FIG. 10D.

Figure 11A:
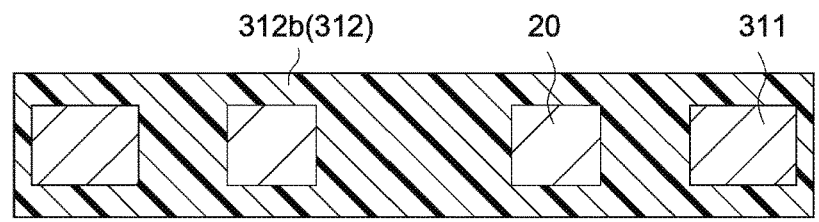
FIGS. 11A to 11D are general cross-sectional views of primary elements, illustrating steps in a method of manufacturing the module substrate illustrated in FIG. 9.

Next, as illustrated in FIG. 11A, an outer resin layer 312b is formed at a prescribed thickness on both surfaces and a peripheral surface of the base material 311. The same resin material used to form the inner resin layer 312a is typically used as the synthetic resin material to form outer resin layer 312b. The inner resin layer 312a and the outer resin layer 312b constitute the resin layer 312.

Figure 11B:
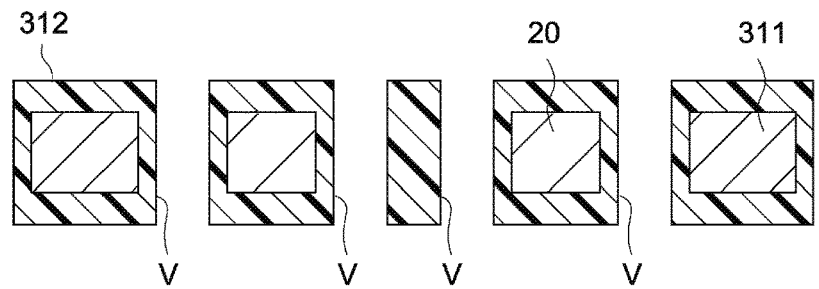
Figure 13:
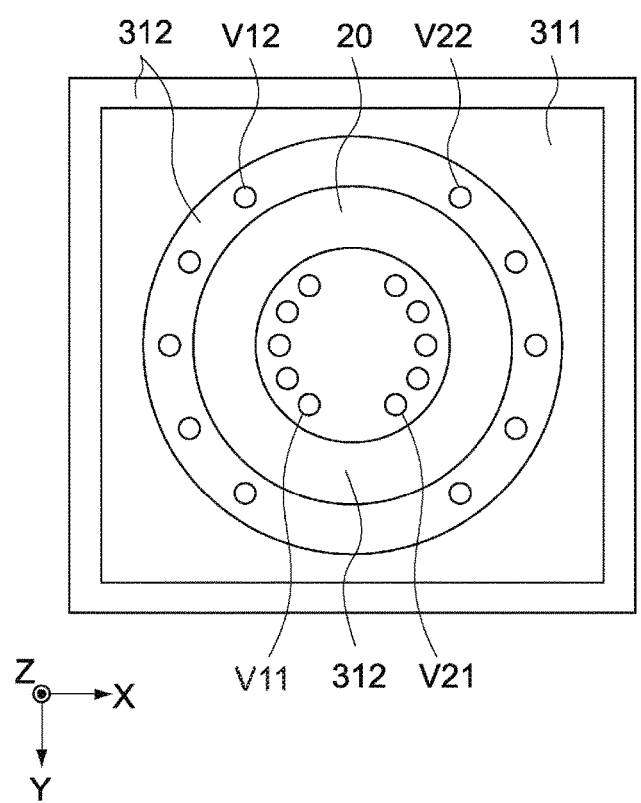
FIG. 13 is a general plan view of primary elements, illustrating a step in the manufacture of the module substrate illustrated in FIG. 9.

Then, as illustrated in FIG. 11B, a plurality of vias V (V11, V12, V21, and V22) are formed in respective regions of the resin layer 312 corresponding to inner circumferential areas and outer circumferential areas of the magnetic core 20. There is no special limitation on the method for forming the vias V, and a drilling process, a punching process, a laser process, or the like can be employed, for example. FIG. 13 is a general plan view of the base material 311, indicating the locations where the vias V are formed.

Figure 11C:
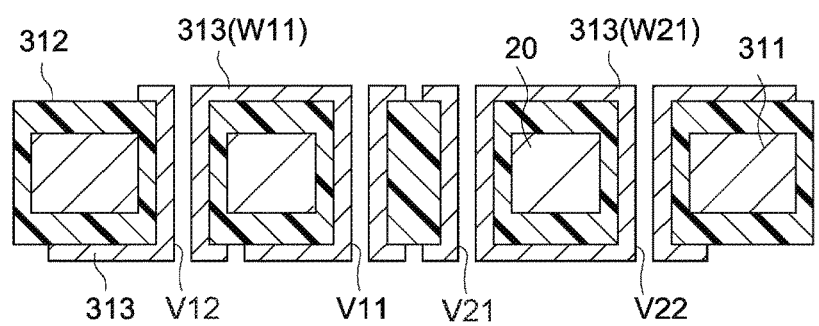
Figure 14:
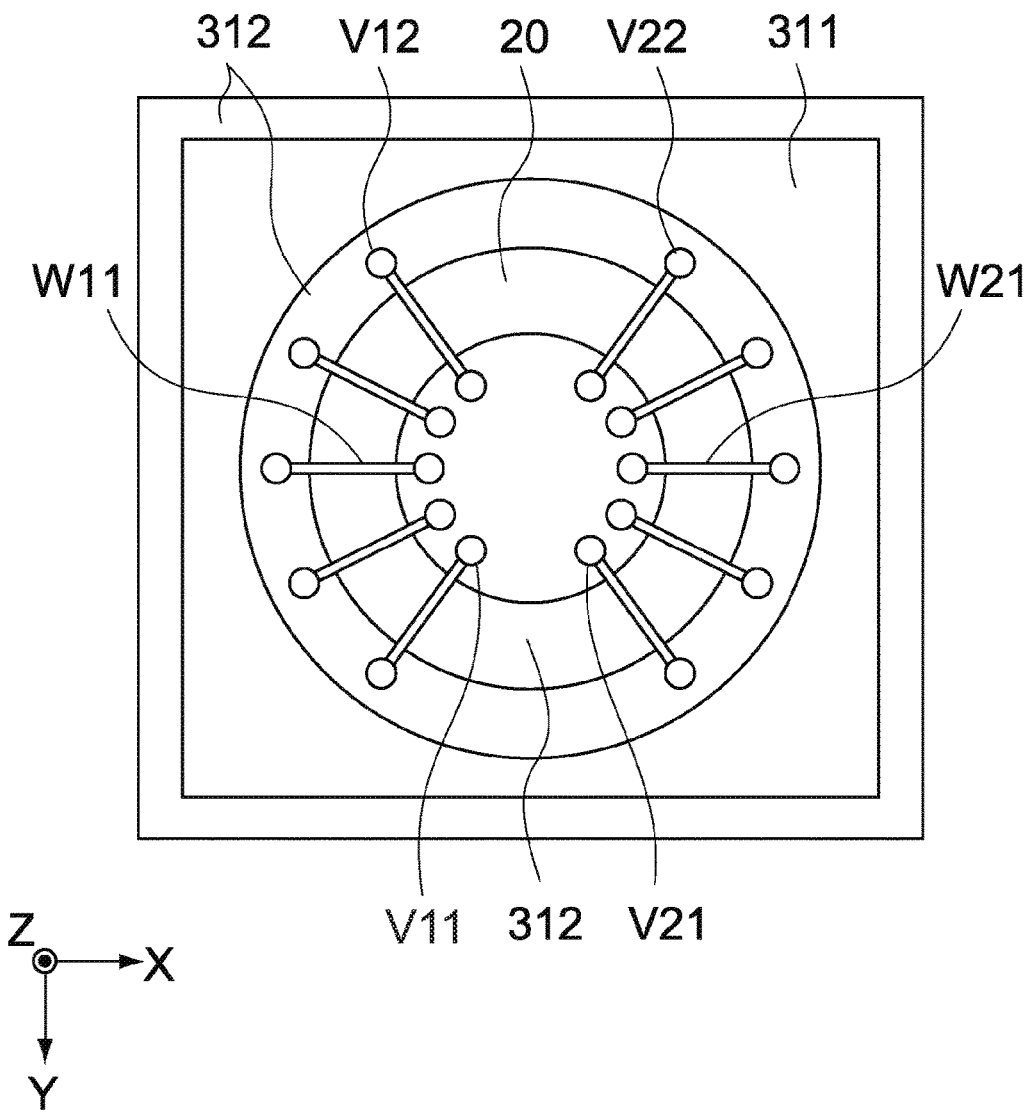
FIG. 14 is a general plan view of primary elements, illustrating a step in the manufacture of the module substrate illustrated in FIG. 9.

Next, as illustrated in FIG. 11C, conductor layers that form the wiring layers 313 are formed on the upper surface and lower surface of the resin layer 312 and the inner circumferential surfaces of the vias V. A metal material such as copper, aluminum, or the like is typically used as the material for forming the conductor layers. Then, the wiring layers 313 including wiring groups W11, W12, W21, and W22 that connect the vias V11 and V12 and the vias V21 and V22, respectively (see FIG. 9), are formed by patterning the conductor layers that have been formed in prescribed shapes. The conductor coil 30 wound around the magnetic core 20 is formed as a part of the wiring layers 313. FIG. 14 is a general plan view of the base material 311, indicating an example of the formation of the wiring groups W11 and W21.

Figure 11D:
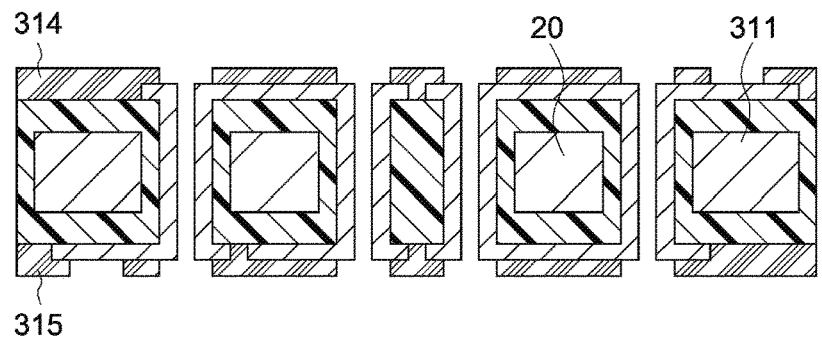

Next, as illustrated in FIG. 11D, the module substrate 3 according to the present embodiment is created by forming insulating layers (solder resists or the like) 314 and 315 on the upper surface and lower surface of the resin layer 312 so as to partially cover the wiring layers 313. A prescribed power module is then formed by mounting IC components, passive components such as capacitors and resistors, and the like onto the surface (the mounting surface) of the module substrate 3.

The module substrate 3 according to the present embodiment manufactured as described above can achieve the same effects as in the above-described Embodiment 1, namely making the module substrate smaller and thinner. Particularly in the present embodiment, the substrate member 310 is constituted of the base material 311 made from metal, which increases the strength of the substrate member 310; furthermore, grounding the base material 311 makes it possible to use the base material 311 as a part of the wiring and enables the base material 311 to function as a shield layer that suppresses electromagnetic noise from propagating to the periphery of the magnetic core 20.

Although embodiments of the present invention have been described thus far, the present invention is not limited to the above-described embodiments, and various changes can of course be added thereto.

For example, although the magnetic core 20 has a toroidal shape in the above embodiments, an axial-shaped magnetic core may be used instead. In this case, the inductor can be configured as a noise removal filter or the like.

In addition, although the above embodiments describe an example of applying the present invention in a power module, the present invention is of course not limited thereto. Furthermore, in addition to the magnetic core 20 and the conductor coil 30, other electronic components such as IC components, capacitors, resistors, and the like may be built into the substrate member.

Furthermore, although the above embodiments describe an example of a configuration in which the magnetic core 20 is sealed by the resin layers 101 and 312, a resin layer having a lower elastic modulus than the resin layers 101 and 312 may be interposed between the magnetic core 20 and the resin layers 101 and 312. This makes it possible to embed the magnetic core 20 within the substrate member 10 or 310 without a loss of magnetic properties even in the case where the magnetic core 20 is formed from a magnetic material having a comparatively high magnetostrictive constant.

It will be apparent to those skilled in the art that various modification and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A module substrate, comprising:
a substrate member having a mounting surface adapted to receive an electronic component that is to be mounted thereon;
a magnetic core embedded inside the substrate member; and
a conductor coil, provided in the substrate member, that is wound around the magnetic core, thereby constituting an embedded inductor,
wherein the substrate member includes a resin layer formed from a first synthetic resin material having a first elastic modulus,
wherein the magnetic core is embedded within the resin layer without a void between the magnetic core and the resin layer,
wherein the magnetic core includes an elastic layer, disposed inside or on an outer surface of the magnetic core, that is formed from a second synthetic resin material having a second elastic modulus lower than the first elastic modulus, the elastic layer being a part of the magnetic core around which the conductor coil is wound, and
wherein the elastic layer is provided in a plurality and the magnetic core is constituted by a multilayer member of magnetic plates that are stacked in a thickness direction of the substrate member or in a direction orthogonal to the thickness direction, said magnetic plates and the plurality of elastic layers are alternately laminated and stacked together in said thickness direction of the substrate member or in said direction orthogonal to the thickness direction.

2. The module substrate according to claim 1,
wherein the magnetic core has a toroidal shape, and
wherein the conductor coil includes:
a plurality of interlayer connecting portions provided on both an inner circumferential side and an outer circumferential side of the magnetic core, the interlayer connecting portions passing through the substrate member in a thickness direction of the substrate member; and
wiring groups, provided on both one surface and another surface of the substrate member, that interconnect the plurality of interlayer connecting portions in an alternating manner along a circumferential direction of the magnetic core.

3. The module substrate according to claim 1, wherein the magnetic plates are stacked in said direction orthogonal to the thickness direction, and said magnetic plates constitute a roll that is formed by winding a magnetic band into a concentric shape.

4. The module substrate according to claim 1,
wherein the substrate member includes a planar metal member having a cavity; and
wherein the resin layer fills the cavity, and the magnetic core is disposed in the cavity so as to be embedded in the resin layer in the cavity.

5. The module substrate according to claim 4, wherein the planar metal member has a same thickness as the magnetic core.

* * * * *